(12) United States Patent
Jordan

(10) Patent No.: US 6,750,438 B2
(45) Date of Patent: *Jun. 15, 2004

(54) SINGLE-ELEMENT ELECTRON-TRANSFER OPTICAL DETECTOR SYSTEM

(75) Inventor: Jeffrey D. Jordan, Williamsburg, VA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 0 days.

This patent is subject to a terminal disclaimer.

(21) Appl. No.: 10/097,702

(22) Filed: Mar. 13, 2002

(65) Prior Publication Data

US 2002/0162946 A1 Nov. 7, 2002

Related U.S. Application Data

(60) Provisional application No. 60/276,568, filed on Mar. 14, 2001.

(51) Int. Cl.[7] .............................................. H01L 31/00
(52) U.S. Cl. .................................... 250/214.1; 313/310
(58) Field of Search .................... 250/214 VT, 330, 250/338.1; 313/103 CM, 310, 523–544

(56) References Cited

U.S. PATENT DOCUMENTS

| | | | |
|---|---|---|---|
| 5,369,266 A | * | 11/1994 | Nohda et al. ............. 250/208.1 |
| 5,726,524 A | | 3/1998 | Debe |
| 5,773,834 A | | 6/1998 | Yamamoto et al. |
| 5,866,434 A | | 2/1999 | Massey et al. |
| 5,889,372 A | | 3/1999 | Beeteson et al. |
| 6,019,656 A | | 2/2000 | Park et al. |
| 6,057,637 A | | 5/2000 | Zettl et al. |
| 6,066,448 A | * | 5/2000 | Wohlstadter et al. .......... 435/6 |
| 6,097,138 A | | 8/2000 | Nakamoto |
| 6,146,227 A | | 11/2000 | Mancevski |
| 6,159,742 A | | 12/2000 | Lieber et al. |
| 6,221,489 B1 | | 4/2001 | Morita et al. |
| 6,231,980 B1 | | 5/2001 | Cohen et al. |
| 6,232,706 B1 | | 5/2001 | Dai et al. |
| 6,239,547 B1 | | 5/2001 | Uemura et al. |
| 6,314,019 B1 | | 11/2001 | Kuekes et al. |
| 6,400,088 B1 | * | 6/2002 | Livingston et al. ........... 315/94 |

* cited by examiner

*Primary Examiner*—David Porta
*Assistant Examiner*—Stephen Yam
(74) *Attorney, Agent, or Firm*—Kurt G. Hammerle

(57) ABSTRACT

An optical detector system includes an electrically resistive screen that is substantially transparent to radiation energy having a wavelength of interest. An electron transfer element (e.g., a low work function photoactive material or a carbon nanotube (CNT)-based element) has a first end and a second end with its first end spaced apart from the screen by an evacuated gap. When radiation energy passes through the screen with a bias voltage being applied thereto, transfer of electrons through the electron transfer element is induced from its first to its second end such that a quantity indicative of the electrons transferred can be detected.

40 Claims, 6 Drawing Sheets

SINGLE-ELEMENT ELECTRON-TRANSFER OPTICAL DETECTOR SYSTEM

CROSS-REFERENCE TO RELATED APPLICATIONS

This application claims the benefit of provisional application Ser. No. 60/276,568 filed Mar. 14, 2001.

This patent application is co-pending with one related patent application entitled "MULTI-ELEMENT ELECTRON-TRANSFER OPTICAL DETECTOR SYSTEM" (NASA Case No. LAR 16279-2), by the same inventor as this patent application.

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

Field of the Invention

This invention relates to optical detectors. More specifically, the invention is a single-element optical detector system for imaging or sensing applications that detects and/or measures photo-induced electron transfer through a micro-scale electron conduction element (e.g., a carbon nanotube (CNT), a photoactive material having a low work function, or a combination of these two) that are spaced from a bias voltage screen through which radiation of interest passes.

SUMMARY OF THE INVENTION

In accordance with the present invention, an optical detector system includes an electrically resistive screen that is substantially transparent to radiation energy having a wavelength of interest. A voltage source is provided to apply a bias voltage to the screen. An electron transfer element (e.g., a low work function photoactive material, a carbon nanotube (CNT), or a CNT topped with a low work function photoactive material) has a first end and a second end with its first end spaced apart from the screen by an evacuated gap. When radiation energy passes through the screen with the bias voltage being applied thereto, transfer of electrons through the electron transfer element is induced from its first to its second end. A detector, electrically coupled to the second end of the electron transfer element, detects a quantity indicative of the electrons transferred through the electron transfer element. The optical detector system can operate as described for imaging applications and can be adapted for sensing applications by providing an analyte-sensitive, luminescent coating on the screen.

DETAILED DESCRIPTION OF THE INVENTION

Figure 1:
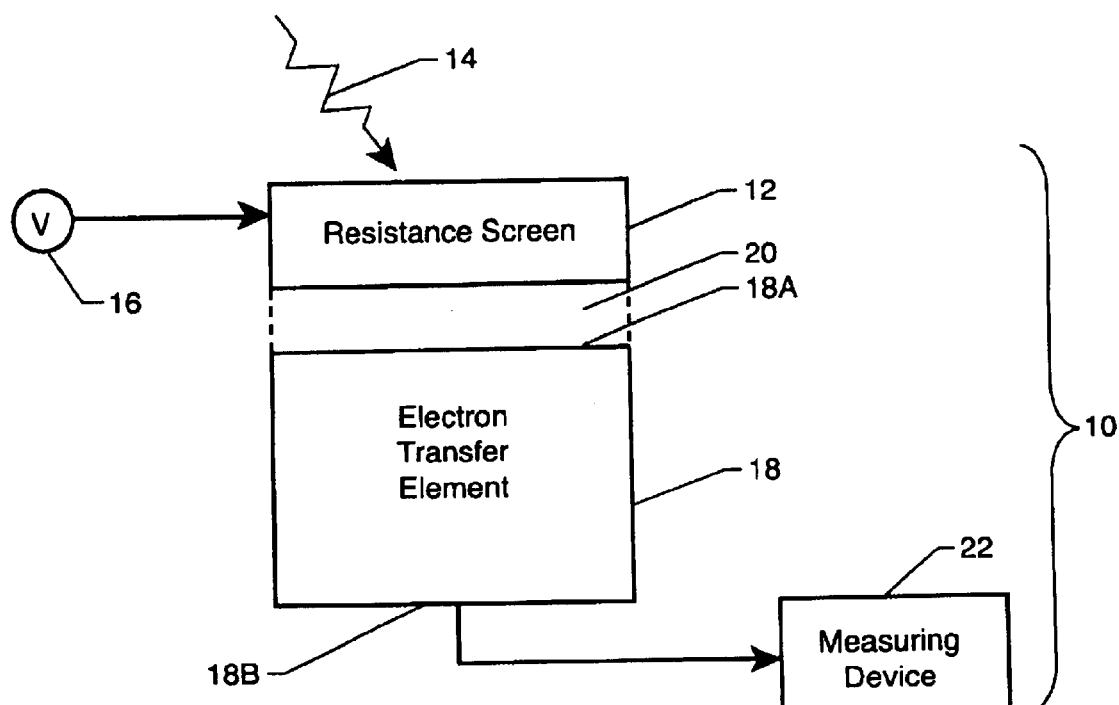
FIG. 1 is a schematic view of a single-element optical detector system constructed in accordance with the present invention.

Referring now to the drawings, and more particularly to FIG. 1, a single-element optical detector system in accordance with an embodiment of the present invention is shown and referenced generally by numeral 10. Optical detector system 10 forms the basic structure used to construct novel imaging elements/systems, sensing elements/systems, or combined imaging and sensing systems, each of which will be described further below.

Optical detector system 10 has a resistance screen 12 disposed in the path of radiation energy 14 that is to be detected and, if desired, measured. Radiation energy 14 can be any visible or invisible light energy. Resistance screen 12 is any electrically resistive material (e.g., electrical resistivity of approximately 60 ohms per square or greater) that is fully transparent or at least substantially transparent to the wavelength range of radiation energy 14. Electrically coupled to resistance screen 12 is a voltage source 16 that applies a biasing voltage to resistance screen 12. Spaced apart from resistance screen 12 is an electron transfer element 18 that can transfer electrons therethrough after it is exposed to radiation energy 14. As will be explained further below, element 18 is preferably a carbon nanotube (CNT) based element, but could also be any photoactive material capable of photo-induced electron transfer. A small gap 20 (i.e., on the order of 100 microns or less) is defined between resistance screen 12 and one end 18A of electron transfer element 18. For reasons that will be explained further below, gap 20 is preferably evacuated. The opposing end 18B of electron transfer element 18 is electrically coupled to a measuring device 22 which can be an ammeter that measures current, a voltmeter that measures voltage, an electron counter that counts electrons reaching end 18B, or a device that measures any combination of current, voltage and electron counts.

In operation, a bias voltage is applied to resistance screen 12 while it is exposed to incident radiation energy 14. Radiation energy 14 passes through resistance screen 12 and is incident on electron transfer element 18 at end 18A thereof. The impingement of radiation energy 14 on electron transfer element 18 induces photoelectron transport therethrough, i.e., electron loss in element 18. The resulting electron vacancies or "holes" left in element 18 are filled with electrons sourced from the voltage-biased resistance screen 12 resulting in a current flow. The photo-induced electron transfer through element 18 is measured at its end 18B. Evacuation of gap 20 minimizes electron collisions in gap 20 thereby ensuring that the vast majority of electrons released from screen 12 will be transferred to element 18. The electron transfer is then detected/measured at end 18B by measuring device 22.

As noted above, optical detector system 10 forms the basic structure for an optical imaging element and system made from an array of such elements. At the heart of each basic structure is electron transfer element 18 which, in general, can be any photoactive material that exhibits electron release/flow following optical interrogation by light of the desired wavelength. The energy required to effect electron release is given by the band-gap energy for a material, and is typically expressed in units of energy, e.g., electron volts. This measurement can be converted to wavelength to provide a measure of the longest wavelength (i.e., lowest energy) photon that will induce the photoelectric effect. Thus, electron transfer element 18 can be used to tailor the sensitivity of optical detector system 10 to specific wavelengths of interest. For example, a photoactive material that does not require a large amount of energy (or "work function") to induce the release of electrons therefrom can be used to construct an optical detector system that is sensitive to very short wavelengths. The work function is the amount of energy required for an electron to be released and depends on the number of electron shells an atom has. That is, the greater the number of shells, the less the work function. This is due to what is known as the "weak force" which is the force that the nucleus of an atom has to retain its electrons. The weak force decreases as the distance from the electron to the atom's nucleus increases. As an electron's weak force decreases, so does the energy needed to free it from the atom.

Photoactive materials having low work functions include, for example, cesiated metals such as cesiated silver oxide (AgOCs), cesiated sodium potassium antimony ([Cs] Na2KSb), and cesiated antimony (SbCs). Other low work function materials include certain semi-conductor materials such as indium gallium arsenic phosphide (InGaAsP), gallium arsenide (GaAs) and sodium potassium antimony (Na2KSb). Note that each of the above-described materials has a preferable wavelength or bandwidth at which electron transfer therethrough is optimized.

Figure 2:
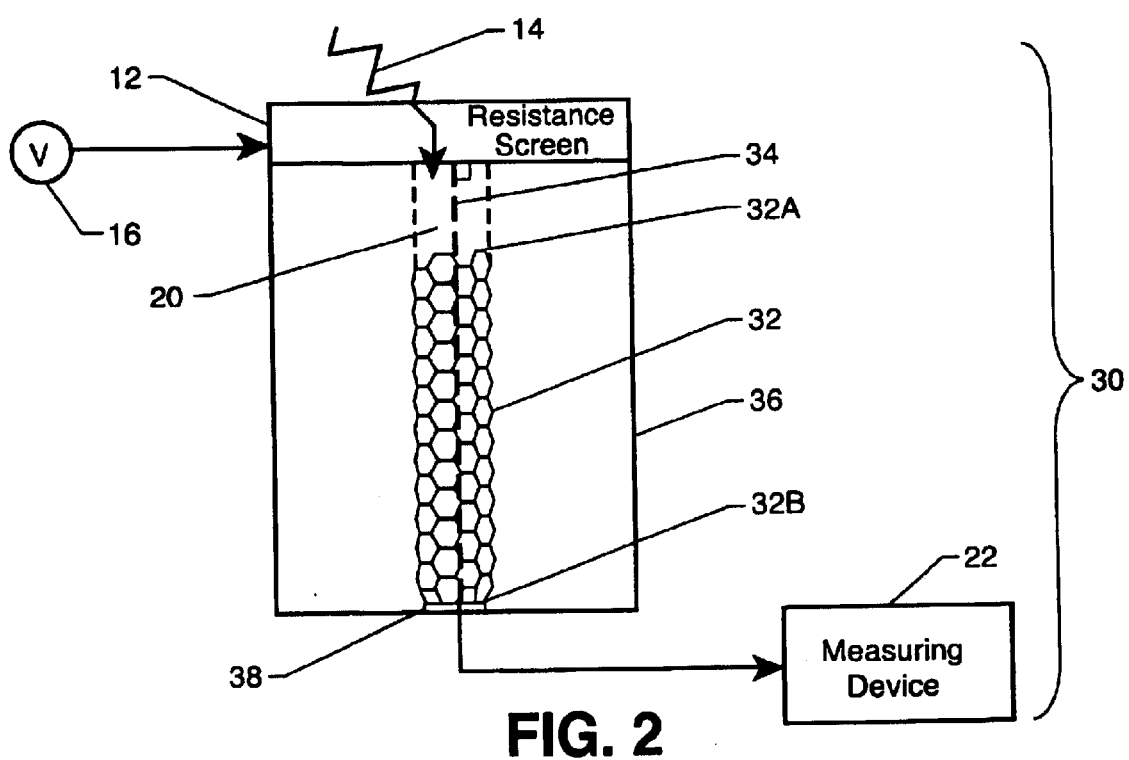
FIG. 2 is a schematic view of one embodiment of a single-element optical detector system having a carbon nanotube (CNT) electron transfer element.

To construct optical detector systems in accordance with the present invention that have a high-degree of spatial resolution, sensitivity and bandwidth, it is preferred that electron transfer element 18 be constructed partially or totally from a carbon nanotube (CNT). As is known in the art, CNTs are longitudinally-extending carbon fibril structures having a high electrical conductivity. A variety of known growth techniques can be used to construct single-wall (SW) and multi-wall (MW) CNTs having diameters as small as one nanometer. Accordingly, FIG. 2 illustrates a single imaging element 30 using a CNT. Common reference numerals will be used for elements already described above.

In single imaging element 30, resistance screen 12 (biased by a biasing voltage from source 16) is exposed to radiation energy 14. Resistance screen 12 can be realized by a substantially transparent wire mesh screen. However, if absolute transparency over a broad wavelength spectrum is desired, resistance screen 12 can be realized by a sheet of indium tin oxide. Spaced apart from resistance screen 12 by gap 20 is a CNT 32 positioned such that its longitudinal axis 34 is substantially perpendicular to resistance screen 12. Note that system 30 will still function if longitudinal axis 34 is not perpendicular to resistance screen 12, although some electron transfer losses may occur. CNT 32 is representative of a single-wall CNT (SWCNT) or a multi-wall (MWCNT). Although current fabrication techniques favor MWCNTs over SWCNTs (owing to the complexities associated with controlling alignment of SWCNTs during the growth thereof), it is to be understood that the present invention can use either type.

The gap 20 between resistance screen 12 and one longitudinal end 32A of CNT 32 is on the order of 100 microns or less. To provide for evacuation of gap 20, an evacuated chamber 36 can be provided to enclose resistance screen 12 and CNT 32 with screen 12 still being capable of having radiation energy 14 impinge thereon. A metal electrode 38 can be coupled to the other longitudinal end 32B of CNT 32 to provide a measurement point for measuring device 22.

Figure 3:
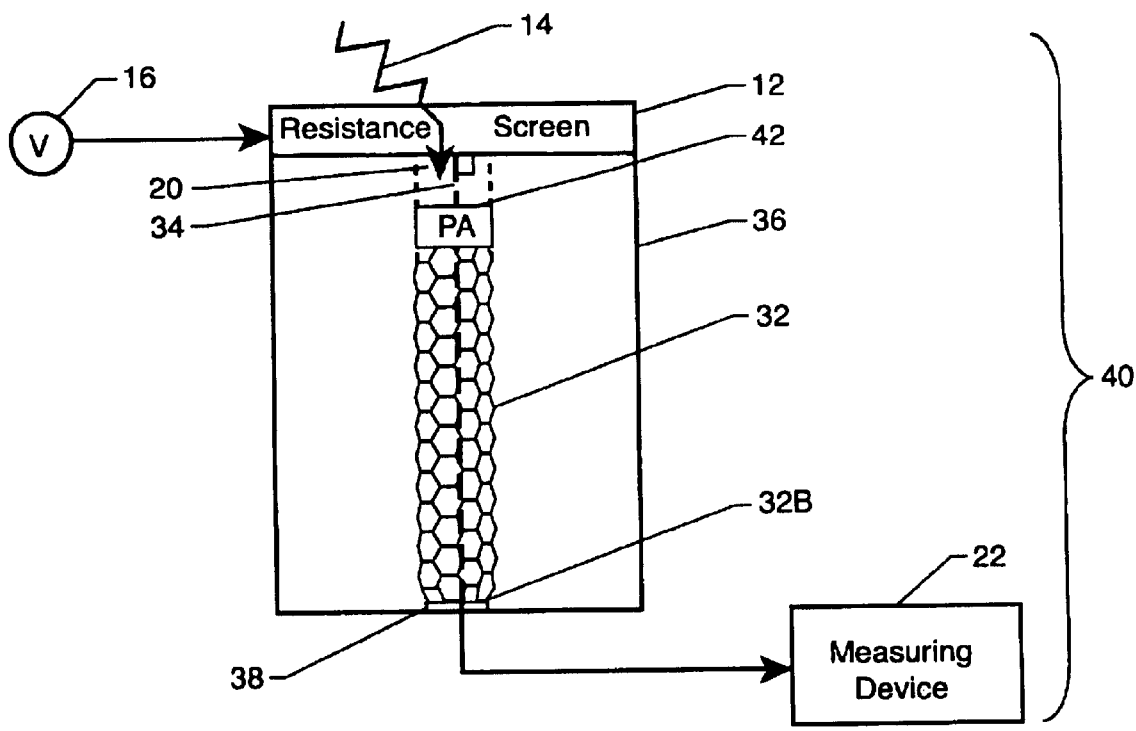
FIG. 3 is a schematic view of another embodiment of a single-element optical detector system having its electron transfer element constructed from a CNT topped with a low-work function photoactive material.

If it is desired to be sensitive to a particular wavelength band of radiation energy 14, the optical detector system can be constructed as illustrated in FIG. 3. More specifically, optical detector system 40 is identical to system 30 except that end 32A of CNT 32 is "topped" with a layer of a low work function photoactive material (PA) 42, several of which were described above. In this way, electron transfer through CNT 32 is induced only by the presence of a radiation energy 14 that is in the wavelength region to which photoactive material 42 is sensitive.

Figure 4:
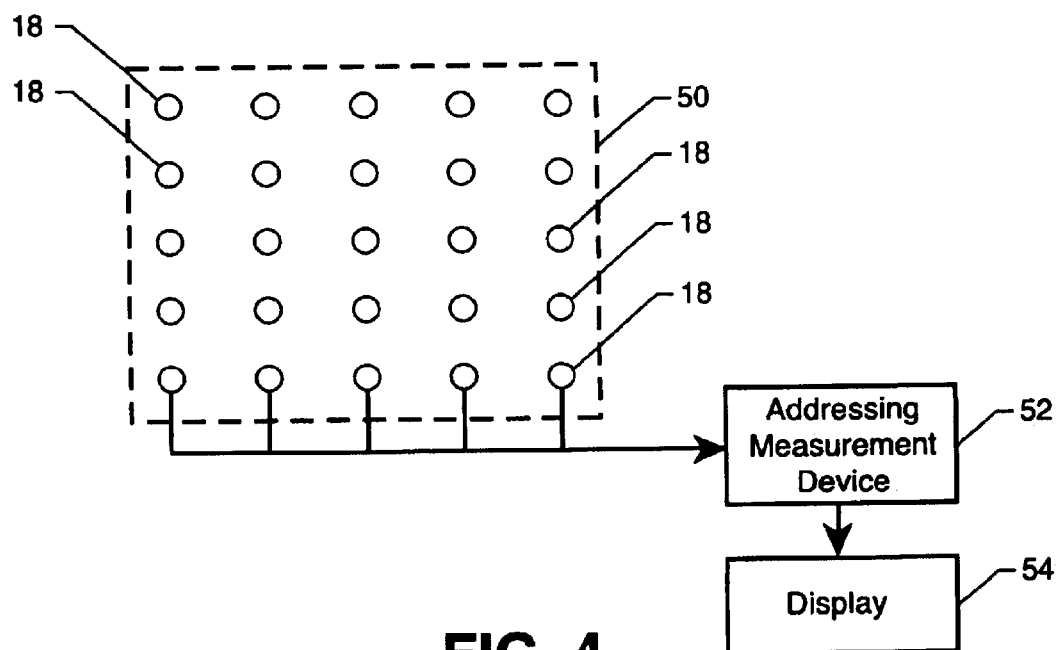
FIG. 4 is a schematic plan view of an embodiment of a multi-element imaging system constructed from single-element optical detector systems.

Each of the above-described optical detector system "elements" can be used in an imaging system constructed from an array of such elements. This embodiment is illustrated schematically in FIG. 4 where an array 50 of optical detector elements based on system 10 are provided. In this plan view, the resistance sheet is omitted for clarity of illustration so that each of electron transfer elements 18 is visible. Note that systems 30 or 40 could also be used to construct array 50. Further, a combination of systems 10, 30 and 40 could be used to construct such an imaging array. In this way, portions of the imaging array could be made more sensitive to a particular wavelength region of incoming radiation energy. Also, note that an image pixel can be formed by one or more of electron transfer elements 18.

Each element 18 is uniquely addressable and can have its electron transfer amounts detected/measured by addressing measurement device 52. That is, measurement device 52 functions as an individual measuring device (analogous to measurement device 22 described above) for all of elements 18. The simultaneously-read outputs from device 52 can be provided to a display 54.

Figure 5:
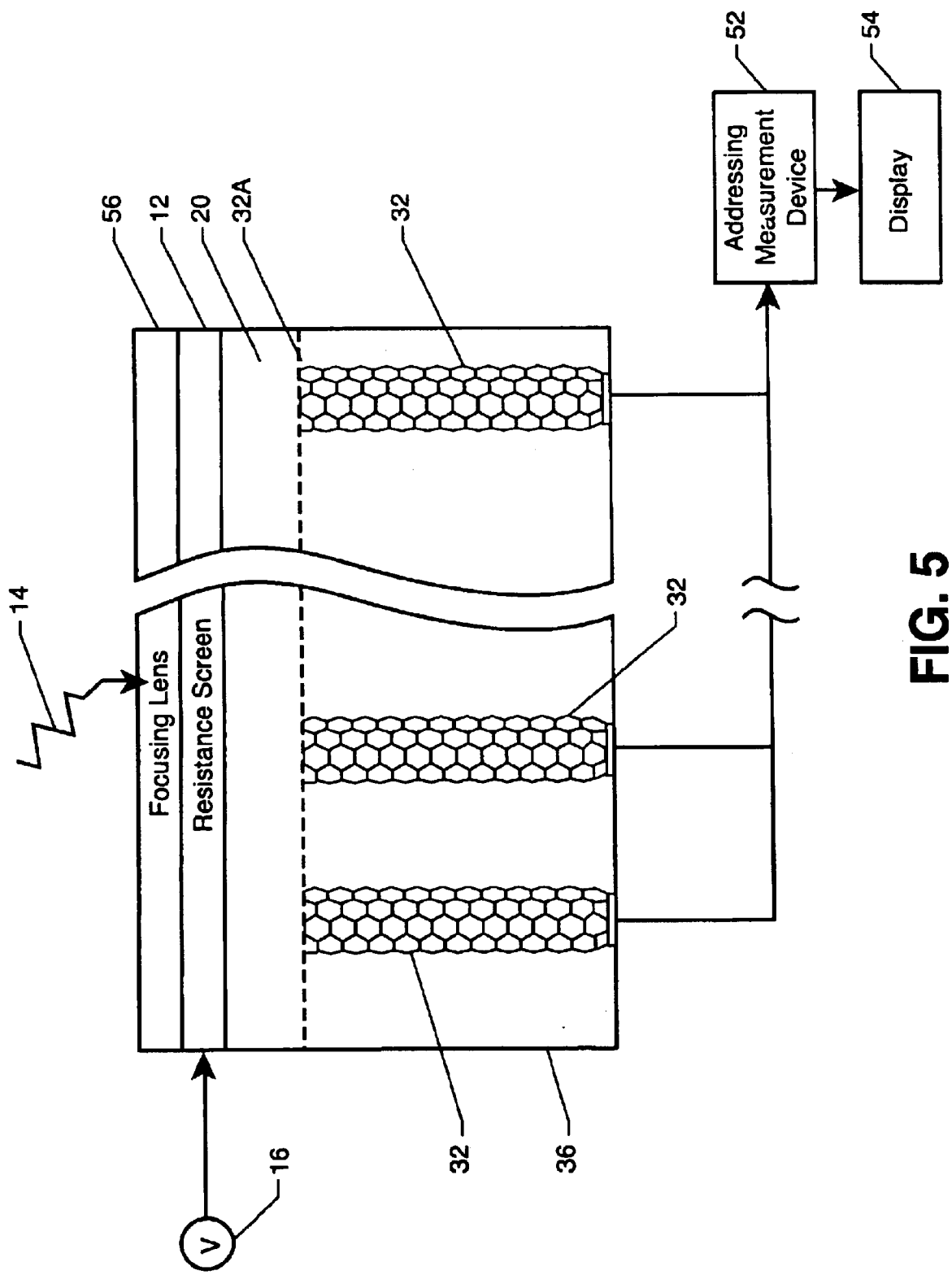
FIG. 5 is a schematic view of the multi-element imaging system using a common resistance screen and a focusing-lens.

Although each element in an imaging array can be constructed individually, some economy of scale can be applied in the construction process without departing from the scope of the present invention. For example, as illustrated in FIG. 5, a single resistance screen 12 can be used to span gap 20 between ends 32A of an array of CNTs 32 that reside in a common evacuated chamber 36. Further, if necessary, a focusing lens 56 can be placed in front of resistance screen 12 to bring an imaged area/object into focus.

Figure 6:
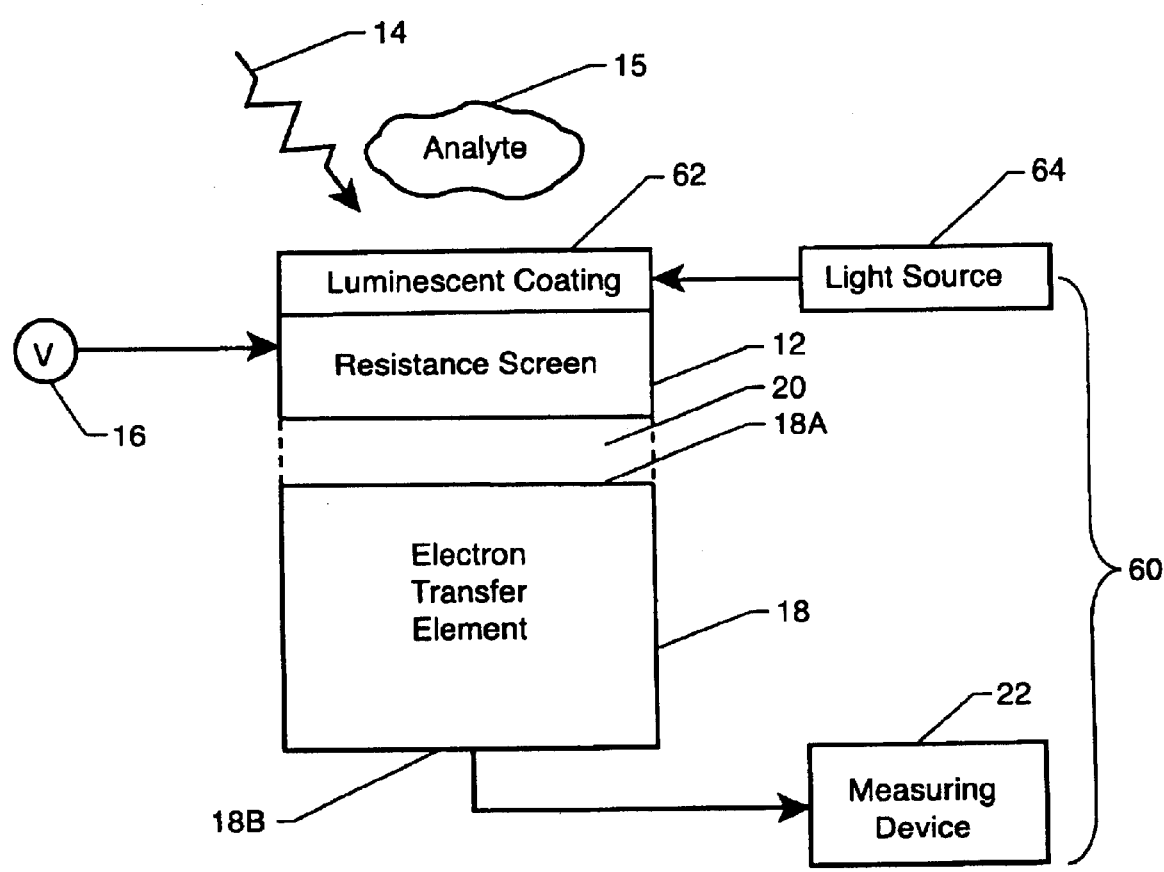
FIG. 6 is a schematic plan view of a single-element optical detector system capable of sensing an analyte of interest.

The present invention can also be used in a sensing capacity. To illustrate this, optical detector system 10 (FIG. 1) has been modified to yield optical detector system 60 shown in FIG. 6 that can sense an analyte of interest. However, it is to be understood that either of optical detector systems 30 and 40 could be similarly modified without departing from the scope of the present invention. As used herein, "analyte" means any gas or liquid-phase species for which an optical transduction mechanism exists or could be developed.

Optical detector system 60 includes a luminescent coating layer 62 deposited on resistance screen 12. Layer 62 is representative of an optical transduction mechanism and is generally realized by any coating that experiences changes in luminescence (e.g., brightness, color, excited state lifetime) in the presence of a particular analyte 15. Because some luminescent coatings must be optically excited during operation thereof, a light source 64 can be coupled to layer 62. Of course, the excitation light source could be integrated or incorporated in layer 62. Still further, in an array of such detectors, a single light source could be used to excite the luminescent coating(s).

Operation of optical detector system 60 is similar to that of optical detector system 10, except that changes in luminescence of coating layer 62 would also be quantified. Specifically, the change in luminescence brought about by the concentration of analyte 15 will cause electron transfer through element 18 to increase or decrease. Such changes are recorded at measuring device 22.

Figure 7:
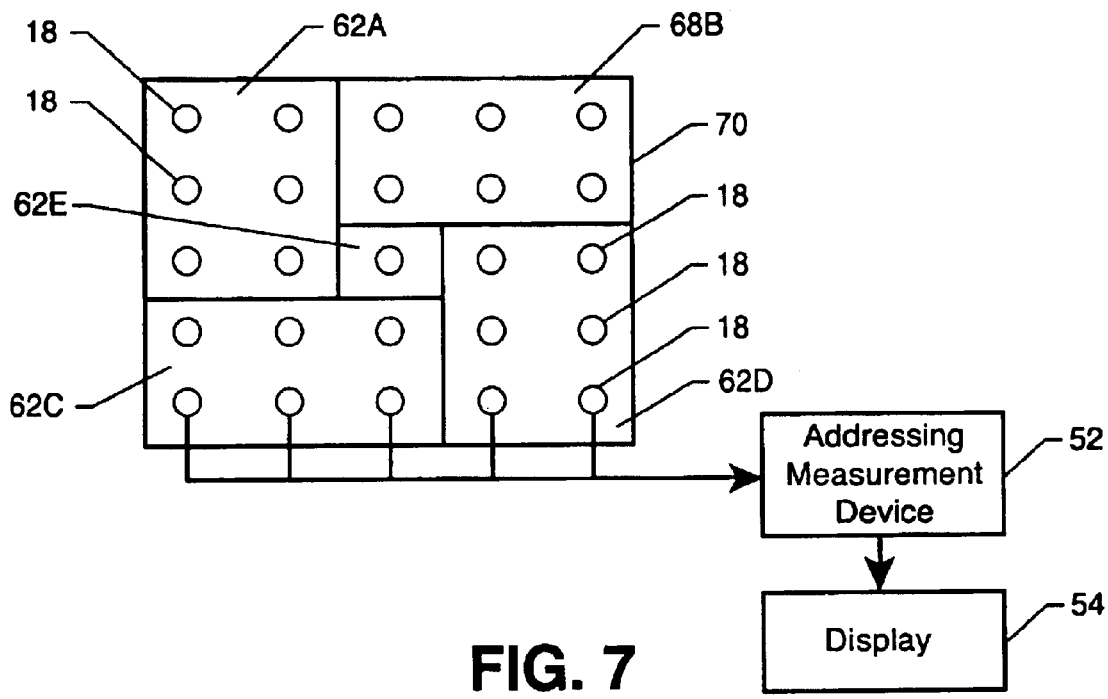
FIG. 7 is a schematic plan view of an embodiment of a multi-element sensing system constructed from single-element optical detector systems.

A sensing array based on a plurality of optical detector systems 60 can be constructed in a fashion similar to the construction of the imaging array. By way of example, this embodiment is illustrated in FIG. 7 where an array 70 of optical detector elements based on system 60 are provided. Although not illustrated in FIG. 7, a common resistance screen and gap can be provided above each electron transfer element 18 similar to the construction shown in FIG. 5. Further, a single common luminescent coating layer could be provided above the entire array 70. However, array 70 can also be constructed to sense/measure changes in a variety of analyte concentrations. That is, in the illustrated embodiment example, array 70 is formed with a plurality of different luminescent coating materials 62A–62E. Note that elements 18 are shown in phantom to illustrate their position under coating materials 62A–62E. Each of the luminescent coating materials 62A–62E can be associated with one or more elements 18. For example, as is shown in FIG. 7 as coating material 62E, the more sensitive coating materials may require only one element 18 to achieve the particular analyte sensing/measurement.

Figure 8:
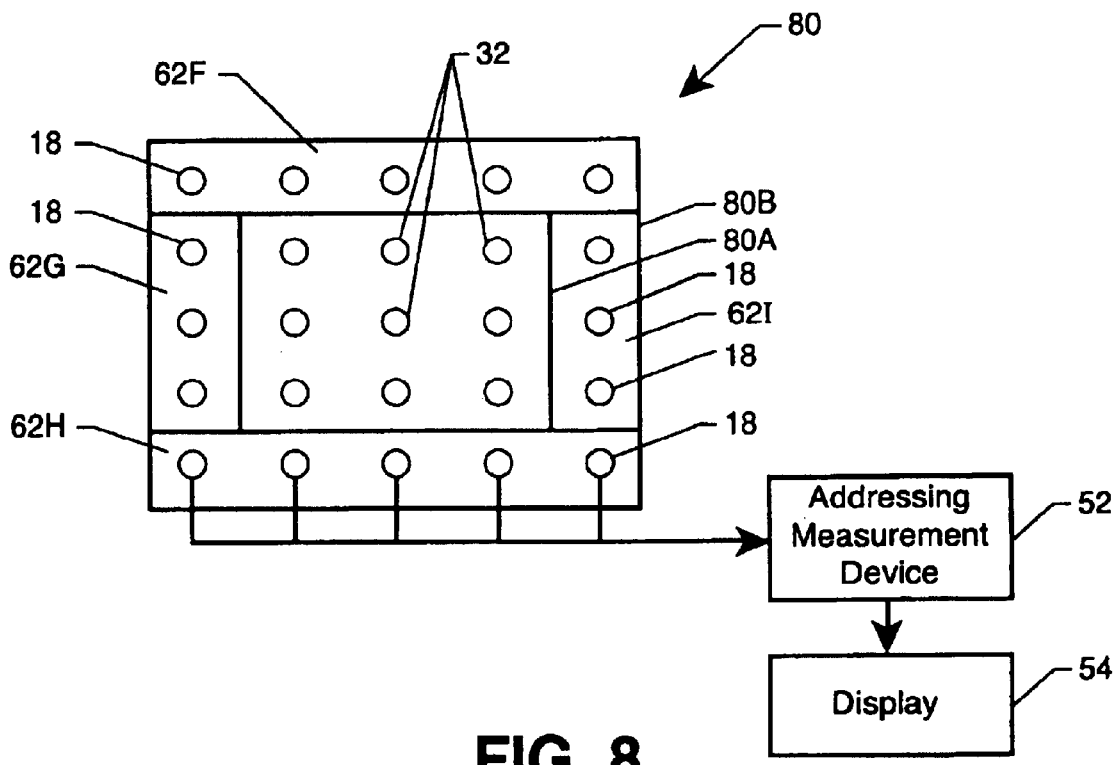
FIG. 8 is a schematic plan view of a multi-element system that combines imaging and sensing capabilities.
Figure 9:
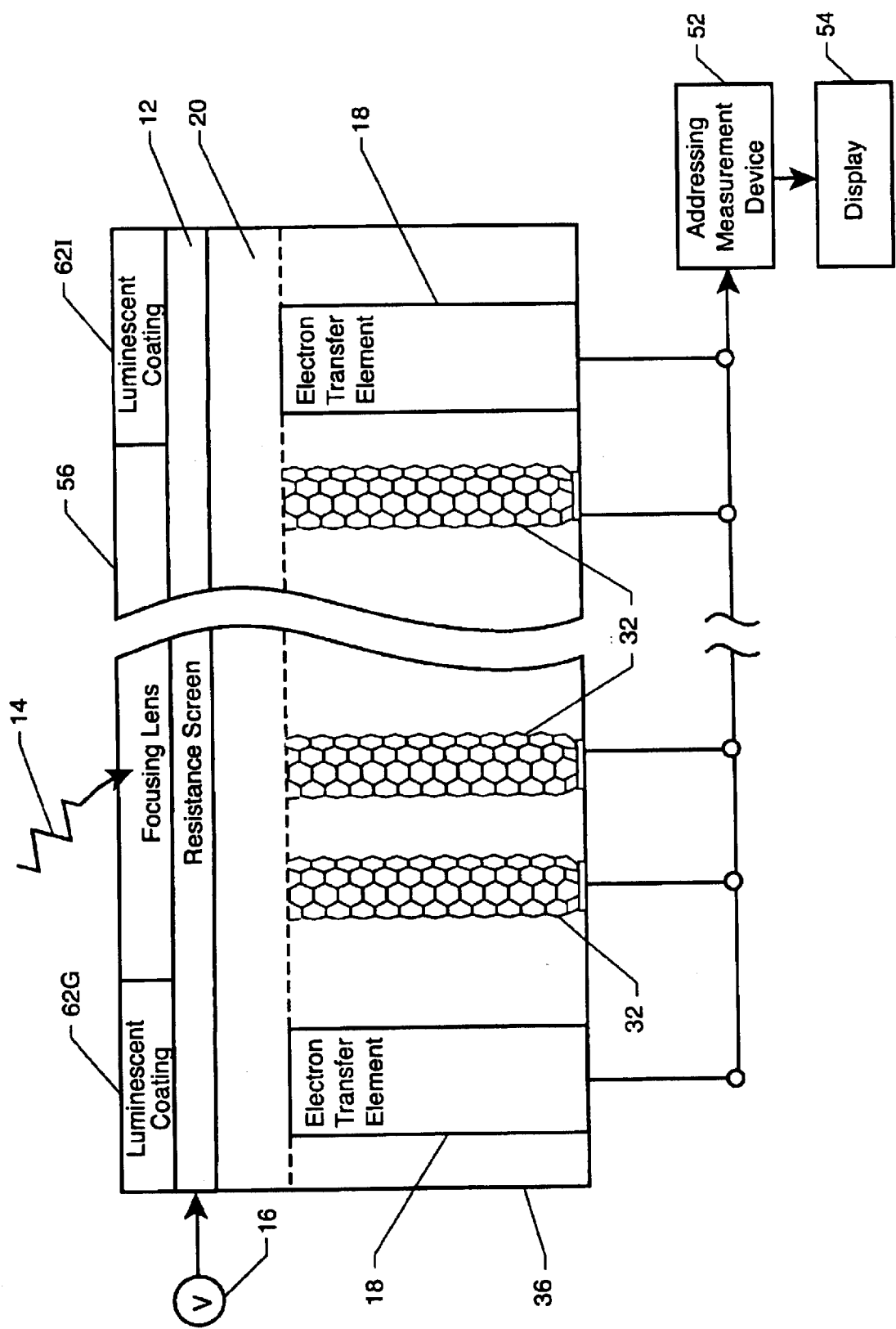
FIG. 9 is a schematic side view of the combined imaging and sensing multi-element system.

The present invention can be further adapted to provide a combination imaging and sensing array optical detector system. One such combination system is illustrated by way of example in FIGS. 8 and 9, where like reference numerals are used for elements already described herein. In the plan view shown in FIG. 8, an array 80 is constructed with an inner arrangement 80A of imaging elements based on, for example, system 30, and a surrounding arrangement 80B of sensing elements based on system 60. Once again, for clarity of illustration, the plan view of FIG. 8 omits the illustration of the resistance screen and subsequent evacuated gap between the electron transfer elements. Note that the surrounding luminescent coating layer can comprise different coating materials 62F–62I sensitive to different analytes. The above-described combined imaging and sensing construction is also illustrated in a side view in FIG. 9. The same resistance screen 12 can be used across the entirety of array 80 (i.e., over all elements 18 and CNTs 32) while focusing lens 56 is positioned over inner arrangement 80A of imaging elements based on CNTs 32.

The device architecture of the present invention exploits the unique properties of CNTs (e.g., high strength-to-mass ratio and high electrical conductivity) in the development of an imaging and sensing platform with abundant spatial resolution and extremely high bandwidth (e.g., in excess of one gigahertz). The present invention may be well suited for large-scale production due to its simple operational concept. As the level of sophistication and control over the growth and alignment of single-wall CNTs (SWCNT) increases, additional advances in the CNT-based imaging and sensing device will be realized due to the greater strength and conductivity of SWCNTs versus their MWCNT counterparts.

The present invention can be used for scientific, industrial and recreational imaging science. Further, the development of CNT-based imaging technology coupled with near-field microscopy could be used for the biological and immunological sciences. Finally, the concept of nanoscopic imaging and sensing elements lends itself to the production of space-suitable systems based on their low weight, high (information) density, low power consumption, and high bandwidth.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed as new and desired to be secured by Letters Patent of the United States is:

1. An optical detector system, comprising:

means for supplying electrons, said means for supplying electrons being substantially transparent to radiation energy having a wavelength of interest, said means for supplying also being electrically resistive;

a voltage source for applying a bias voltage to said means for supplying;

means for transferring electrons, said means for transferring having a first end and a second end, said means for transferring having said first end thereof spaced apart from said means for supplying electrons by an evacuated gap wherein, when the radiation energy passes through said means for supplying with the bias voltage being applied thereto, transfer of electrons through said means for transferring is induced from said first end to said second end thereof, wherein said means for transferring comprises a carbon nanotube (CNT); and detection means, electrically coupled to said second end of said means for transferring, for detecting a quantity indicative of the electrons transferred through said means for transferring.

2. An optical detector system as in claim 1 further comprising a luminescent-based, analyte-sensing means positioned to have the radiation energy pass therethrough before impingement on said means for supplying, said analyte-sensing means changing in terms of at least one luminescent property in the presence of an analyte of interest.

3. An optical detector system as in claim 1 wherein said means for supplying electrons is a material having an electrical resistivity of at least approximately 60 ohms per square.

4. An optical detector system as in claim 1 wherein said means for supplying electrons is indium tin oxide.

5. An optical detector system as in claim 1 wherein said means for transferring electrons comprises a photoactive material that experiences electron release in the presence of radiation energy.

6. An optical detector system as in claim 1 wherein said carbon nanotube (CNT) has a longitudinal axis extending between said first end and said second end of said means for transferring electrons.

7. An optical detector system as in claim 6 wherein said CNT is a multi-wall carbon nanotube (MWCNT).

8. An optical detector system as in claim 1 wherein said carbon nanotube (CNT) has a longitudinal axis extending between a first end and a second end of said CNT, wherein said second end of said CNT forms said second end of said means for transferring electrons, and wherein said means for transferring electrons further comprises a photoactive material positioned on said first end of said CNT wherein said photoactive material forms said first end of said means for transferring electrons.

9. An optical detector system as in claim 8 wherein said CNT is a multi-wall carbon nanotube (MWCNT).

10. An optical detector system as in claim 1 wherein said detection means comprises an ammeter.

11. An optical detector system as in claim 1 wherein said detection means comprises a voltmeter.

12. An optical detector system as in claim 1 wherein said detection means comprises means for counting the number of electrons reaching said second end of said means for transferring.

13. An optical detector system as in claim 1 further comprising an evacuated chamber enclosing said means for supplying electrons and said means for transferring, said evacuated chamber having a portion thereof transparent to the radiation energy and positioned to permit impingement of the radiation energy on said means for supplying.

14. An optical detector system, comprising:
   resistance means transparent to radiation energy having a wavelength of interest and being electrically resistive;
   a voltage source for applying a bias voltage to said resistance means;
   a carbon nanotube (CNT)-based element having a longitudinal axis extending between a first end and a second end thereof, said CNT-based element being capable of electron transfer therethrough, said CNT-based element positioned with the longitudinal axis approximately perpendicular to said resistance means with said first end thereof spaced apart from said resistance means by an evacuated gap wherein, when the radiation energy passes through said resistance means with the bias voltage being applied thereto, transfer of electrons through said CNT-based element is induced from said first end to said second end thereof; and
   detection means, electrically coupled to said second end of said CNT-based element, for detecting a quantity indicative of the electrons transferred through said CNT-based element.

15. An optical detector system as in claim 14 further comprising a luminescent-based, analyte-sensing means positioned to have the radiation energy pass therethrough before impingement on said resistance means, said analyte-sensing means changing in terms of at least one luminescent property in the presence of an analyte of interest.

16. An optical detector system as in claim 14 wherein said resistance means is a material having an electrical resistivity of at least approximately 60 ohms per square.

17. An optical detector system as in claim 14 wherein said resistance means is indium tin oxide.

18. An optical detector system as in claim 14 wherein said CNT-based element comprises a multi-wall carbon nanotube (MWCNT).

19. An optical detector system as in claim 14 wherein said CNT-based element comprises:

a CNT; and
a photoactive material positioned on said CNT to form said first end of said CNT-based element.

20. An optical detector system as in claim 19 wherein said CNT is a multi-wall carbon nanotube (MWCNT).

21. An optical detector system as in claim 14 wherein said detection means comprises an ammeter.

22. An optical detector system as in claim 14 wherein said detection means comprises a voltmeter.

23. An optical detector system as in claim 14 wherein said detection means comprises means for counting the number of electrons reaching said second end of said second means.

24. An optical detector system as in claim 14 further comprising an evacuated chamber enclosing said resistance means and said CNT-based element, said evacuated chamber having a portion thereof transparent to radiation energy and positioned to permit impingement of radiation energy on said resistance means.

25. An optical detector system, comprising:
   resistance means transparent to radiation energy having a wavelength of interest and being electrically resistive;
   a voltage source for applying a bias voltage to said resistance means;
   a multi-wall carbon nanotube (MWCNT) having a longitudinal axis extending between a first end and a second end thereof, said MWCNT positioned with the longitudinal axis approximately perpendicular to said resistance means with said first end thereof spaced apart from said resistance means by a gap;
   evacuation means cooperating with said gap for placing said gap in an evacuated state wherein, when radiation energy passes through said resistance means with the bias voltage being applied thereto, transfer of electrons through said MWCNT is induced from said first end to said second end thereof; and
   detection means, electrically coupled to said second end of said MWCNT, for detecting a quantity indicative of the electrons transferred through said MWCNT.

26. An optical detector system as in claim 25 further comprising a luminescent-based, analyte-sensing means positioned to have radiation energy pass therethrough before impingement on said resistance means, said analyte-sensing means changing in terms of at least one luminescent property in the presence of an analyte of interest.

27. An optical detector system as in claim 25 wherein said resistance means is a material having an electrical resistivity of at least approximately 60 ohms per square.

28. An optical detector system as in claim 25 wherein said resistance means is indium tin oxide.

29. An optical detector system as in claim 25 further comprising a photoactive material positioned on said first end of said multi-wall carbon nanotube.

30. An optical detector system as in claim 25 wherein said detection means comprises an ammeter.

31. An optical detector system as in claim 25 wherein said detection means comprises a voltmeter.

32. An optical detector system as in claim 25 wherein said detection means comprises means for counting the number of electrons reaching said second end of said multi-wall carbon nanotube.

33. An optical detector system, comprising:
   resistance means transparent to radiation energy having a wavelength of interest and being electrically resistive;
   a voltage source for applying a bias voltage to said resistance means;
   a single-wall carbon nanotube (SWCNT) having a longitudinal axis extending between a first end and a second end thereof, said SWCNT positioned with the longitudinal axis approximately perpendicular to said resistance means with said first end thereof spaced apart from said resistance means by a gap;

evacuation means, cooperating with said gap for placing said gap in an evacuated state wherein, when radiation energy passes through said resistance means with the bias voltage being applied thereto, transfer of electrons through said SWCNT is induced from said first end to said second end thereof; and detection means, electrically coupled to said second end of said SWCNT, for detecting a quantity indicative of the electrons transferred through said SWCNT.

34. An optical detector system as in claim 33 further comprising a luminescent-based, analyte-sensing means positioned to have radiation energy pass therethrough before impingement on said resistance means, said analyte-sensing means changing in terms of at least one luminescent property in the presence of an analyte of interest.

35. An optical detector system as in claim 33 wherein said resistance means is a material having an electrical resistivity of at least approximately 60 ohms per square.

36. An optical detector system as in claim 33 wherein said resistance means is indium tin oxide.

37. An optical detector system as in claim 33 further comprising a photoactive material positioned on said first end of said single-wall carbon nanotube.

38. An optical detector system as in claim 33 wherein said detection means comprises an ammeter.

39. An optical detector system as in claim 33 wherein said detection means comprises a voltmeter.

40. An optical detector system as in claim 33 wherein said detection means comprises means for counting the number of electrons reaching said second end of said single-wall carbon nanotube.

* * * * *